(12) United States Patent
Cruz et al.

(10) Patent No.: US 7,972,906 B2
(45) Date of Patent: Jul. 5, 2011

(54) SEMICONDUCTOR DIE PACKAGE INCLUDING EXPOSED CONNECTIONS

(75) Inventors: Erwin Victor R. Cruz, Koronadal (PH); Maria Cristina B. Estacio, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 464 days.

(21) Appl. No.: 12/044,314

(22) Filed: Mar. 7, 2008

(65) Prior Publication Data
US 2009/0224383 A1 Sep. 10, 2009

(51) Int. Cl.
*H01L 21/00* (2006.01)
(52) U.S. Cl. ........ 438/125; 438/107; 438/123; 438/117; 257/706; 257/E21.514; 257/E21.51; 257/E23.046
(58) Field of Classification Search .................. 438/123, 438/124, 127, 107, 117, 125; 257/676, 677, 257/706, E21.514, E21.51, E23.046
See application file for complete search history.

(56) References Cited

U.S. PATENT DOCUMENTS

| | | | |
|---|---|---|---|
| 5,221,859 A * | 6/1993 | Kobayashi et al. | ........... 257/676 |
| 6,624,522 B2 | 9/2003 | Standing et al. | |
| 7,285,849 B2 | 10/2007 | Cruz et al. | |
| 2004/0256703 A1* | 12/2004 | Tu et al. | ........... 257/676 |
| 2007/0155058 A1* | 7/2007 | Jereza | ........... 438/123 |
| 2008/0044946 A1 | 2/2008 | Cruz et al. | |
| 2008/0054417 A1 | 3/2008 | Lee et al. | |
| 2008/0173991 A1 | 7/2008 | Cruz et al. | |

OTHER PUBLICATIONS

"Polarpak Product Information," [Online] 2007, [Retrieved on Feb. 18, 2009], Retrieved from: http://www.vishay.com/product?docid=73199&query=sie800df. Entire document.

* cited by examiner

*Primary Examiner* — Jarrett J Stark
*Assistant Examiner* — Wilner Jean Baptiste
(74) *Attorney, Agent, or Firm* — Kilpatrick Townsend & Stockton LLP

(57) ABSTRACT

A clip structure and semiconductor die package. The clip structure includes a first portion and a second portion, with a connecting structure located between the first and second portion. The clip structure is substantially planar. The semiconductor die package includes a semiconductor die located between a leadframe structure and a clip structure. Slots are formed within the molding material covering portions of the semiconductor die package. The slots are located between a first portion and the second portion of the clip structure, and the slot overlap with the semiconductor die.

12 Claims, 5 Drawing Sheets

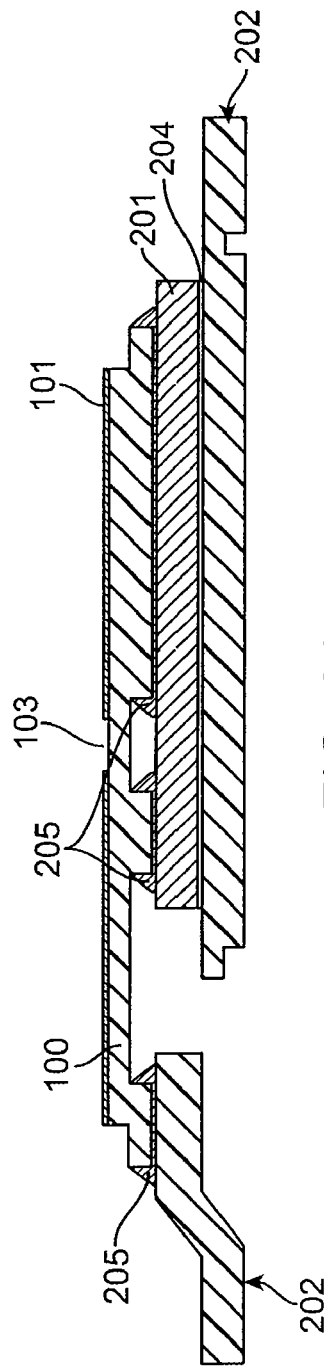
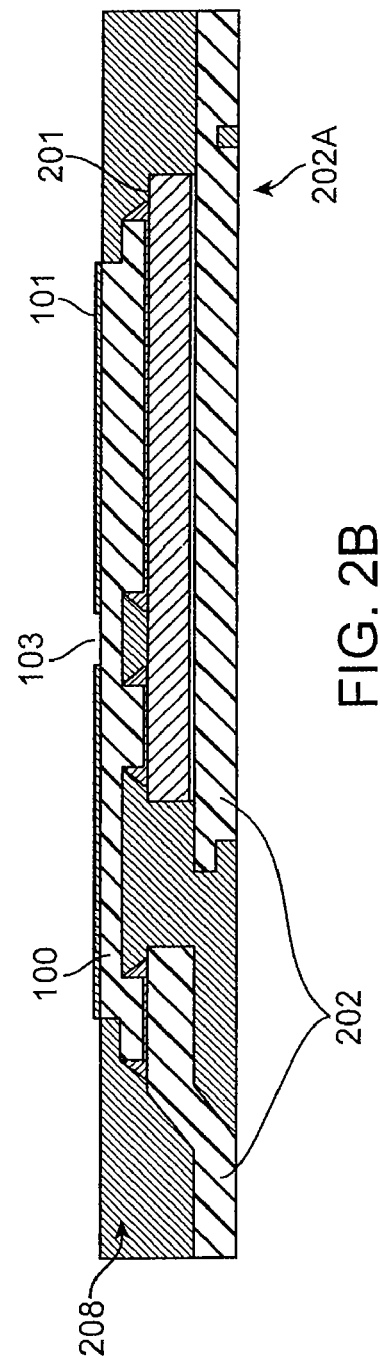
FIG. 2A
FIG. 2B

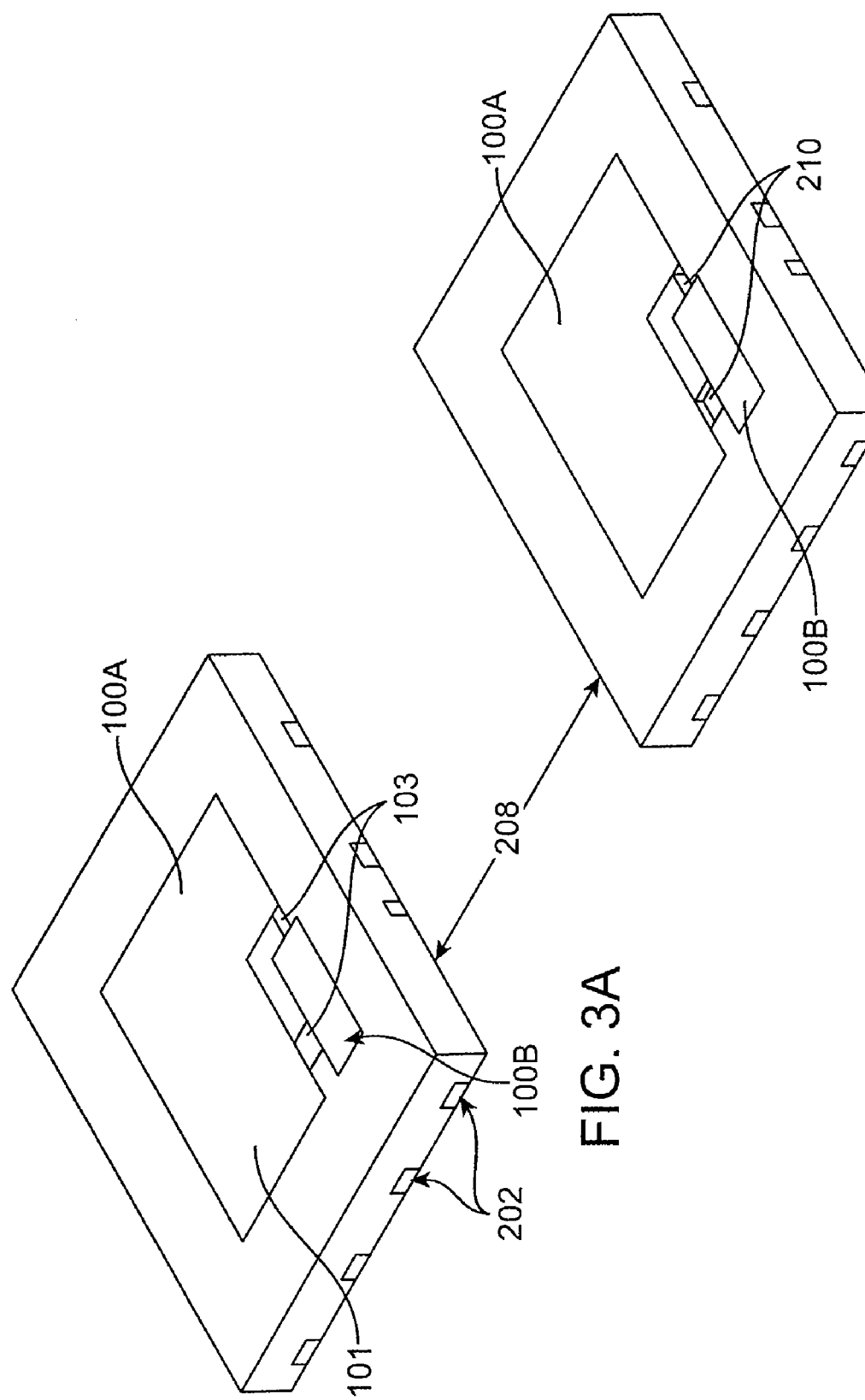

SEMICONDUCTOR DIE PACKAGE INCLUDING EXPOSED CONNECTIONS

BACKGROUND

Semiconductor die packages using conductive clip structures are known in the semiconductor industry, but could be improved. For example, electronic devices such as wireless phones and the like are becoming smaller and smaller. It is desirable to make thinner semiconductor die packages, so that they can be incorporated into such electronic devices. It would also be desirable to improve upon the heat dissipation properties of conventional semiconductor die packages. Semiconductor die packages including power transistors, for example, generate a significant amount of heat.

Commonly used semiconductor die packages are compatible with a micro leadframe package (MLP) footprint. However, such packages have designs that require complicated etching, stamping, and bending processes, especially for the clip structures used within such packages. This can lead to higher costs and additional stresses due to the non-planar nature of the clip structures.

Embodiments of the invention address these and other problems, individually and collectively.

BRIEF SUMMARY

Embodiments of the invention are directed to semiconductor die packages, clips, methods for making semiconductor die packages and clips, as well as electrical assemblies and systems using semiconductor die packages and clips.

One embodiment of the invention is directed towards a method of forming a semiconductor die package. The method comprises obtaining a clip structure including a first portion and a second portion. The first portion is connected to the second portion by a connecting structure. The method also comprises attaching a semiconductor die to the clip structure, wherein the connecting structure overlaps with the semiconductor die, and molding a molding material around the clip structure and semiconductor die. The method also includes removing at least a portion of the connecting structure.

Another embodiment of the invention is directed towards a semiconductor die package. It includes a clip structure including a first portion and a second portion, a leadframe structure, a semiconductor die, wherein the semiconductor die is between the leadframe structure and the clip structure, a molding material covering at least part of the clip structure, the leadframe structure, and the semiconductor die. It also includes a slot formed within the molding material between the first portion and the second portion, wherein the slot overlaps with the semiconductor die.

Another embodiment of the invention is directed towards a clip structure comprising a first portion and a second portion, wherein the second portion is substantially co-planar with the first portion, and a connecting structure, wherein the connecting structure connects the first portion with the second portion and is located between the first portion and the second portion. A plating layer can be present on a base material of the clip structure.

These and other embodiments of the invention are described in detail in the Detailed Description with reference to the Figures. In the Figures, like numerals may reference like elements and descriptions of some elements may not be repeated.

BRIEF DESCRIPTION OF THE DRAWINGS

FIGS. 2A-2D illustrate side views of precursors produced during the formation of a semiconductor die package according to an embodiment of the invention.

FIGS. 3A and 3B show top perspective views of the precursors shown in FIGS. 2B and 2C, respectively.

DETAILED DESCRIPTION

Embodiments of the invention are directed towards semiconductor die packages. A semiconductor die package according to an embodiment of the invention can include a substantially planar clip structure that has a first portion and a second portion. The semiconductor die package can also include a leadframe structure, and a semiconductor die located between the leadframe structure and the clip structure. The semiconductor die package can include a molding material, which may also cover at least part of the clip structure, the leadframe structure, and the semiconductor die.

In the semiconductor die package, there can be a slot formed within the molding material between the first portion and the second portion of the clip structure. The slot overlaps with the semiconductor die. The slot may be filled with molding material or other suitable material, or it may remain empty. If the slot is filled with the same material as the molding material, there can be one or more discernable interfaces between the molding material that we previously formed and the molding material that fills the slot.

Figure 1:
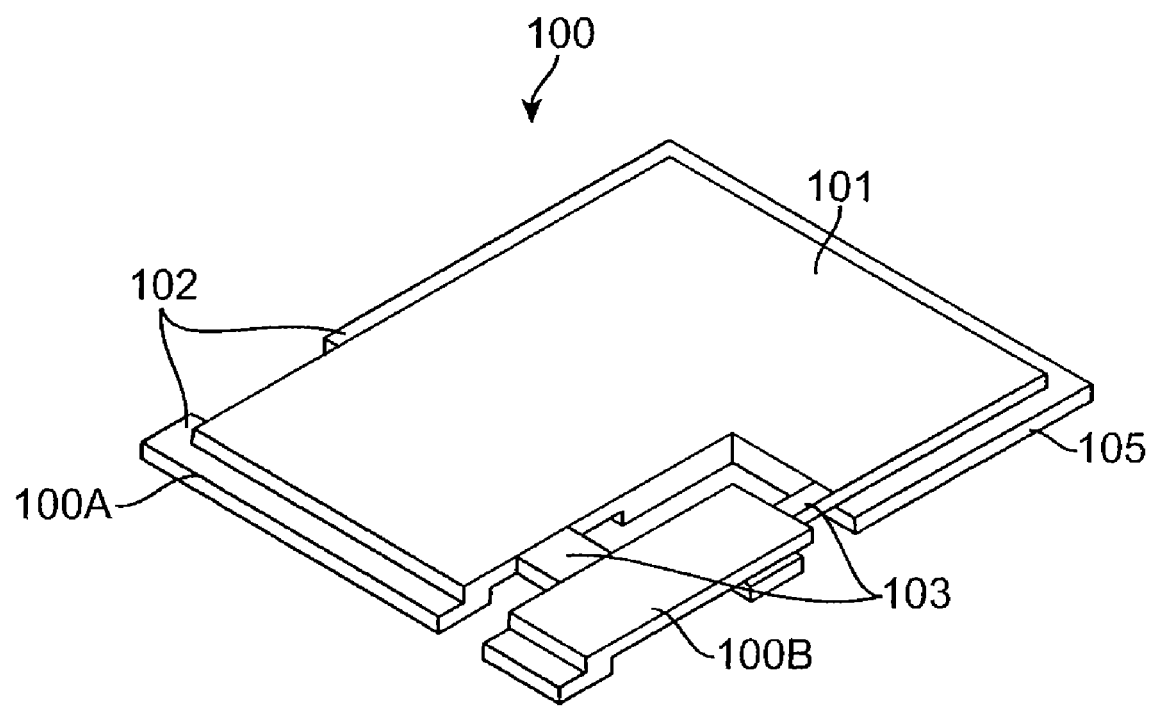
FIG. 1 shows an embodiment of a one-piece clip structure for use in fabricating semiconductor die packages.

FIG. 1 shows an embodiment of a one-piece clip structure 100 which can be used to make a semiconductor die package according to an embodiment of the invention. One piece clip structure 100 is substantially planar and includes a first portion 100A and a second portion 100B. First portion 100A defines a source clip, and second portion 100B can define gate clip. The first portion 100A may function as a source clip for electrically connecting to a source region of a semiconductor die, and second portion 100B may function as a gate clip for electrically connecting to a gate region of a semiconductor die. The one-piece clip structure 100 also includes one or more connecting structures 103 (e.g., tie bars) that connect the first portion 100A to the second portion 100B. The connecting structures 103 can eventually be removed or abraded, so that the first portion 100A and the second portion 100B are electrically isolated from each other in the formed semiconductor die package.

A plating layer 101 covers a portion of the top surface of a clip structure base material 105. In some embodiments, the plating layer 101 covers the base material 105 of both the first portion 100A and the second portion 100B. In other embodiments of the invention, the plating layer 101 need not cover a base material associated in the second portion 100B. Plating layer 101 may comprise any suitable plating material known in the art, including metals such as a nickel alloy, such as NiPdAu.

Edge regions 102 of the base material 105 of the clip structure 100 that are not covered by plating layer 101 can be half etched or partially etched. These regions 102 of the clip structure 100 have had a certain amount of material removed, such that they are thinner than other regions of the clip structure 100. The thinner regions 102 can be used for mold locking.

FIGS. 2A-2D illustrate side views of semiconductor die package precursors that are formed in methods according to embodiments of the invention. Although the formation of one semiconductor die package is shown in FIGS. 2A-2D, in embodiments of the invention, semiconductor die packages may be formed in an array and in parallel with a number of other semiconductor die packages.

The semiconductor die 201, the leadframe structure 202, and the one-piece clip structure 100 may be attached together as shown in FIG. 2A in any suitable order.

The term "leadframe structure" can refer to a structure that is derived from or is the same as a leadframe. Each leadframe structure can include two or more leads with lead surfaces and a die attach region. The leads extend laterally from the die attach region. A single lead frame structure may include a gate lead structure, and a source lead structure.

The leadframe structure 202 may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.5 mm).

The leadframe structure 202 can be etched and/or patterned using conventional processes to shape the leads or other portions of the leadframe structure. For example, the leadframe structure 202 can be formed by etching a continuous conductive sheet to form a predetermined pattern. Before or after etching, the leadframe structure 202 can also be stamped so that a die attach surface of the leadframe structure is downset with respect to some lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframes structures. The leadframe structure 202 may be a continuous metallic structure or a discontinuous metallic structure.

The clip structure 100 may also be obtained using any suitable process. For example, the clip structure 100 may be obtained by a process such as stamping or etching. The clip structure 100 can comprise a first portion connected to a second portion by a connecting structure 103.

The clip structure 100 may comprise a base material such as copper, aluminum, or any other suitable metal that can conduct electricity. It may also be plated with other metals. The clip structure 100 may be formed singly, or in an array of clip structures and then separated from the array of clip structures according to methods known to those skilled in the art. This will create a plurality of separated clip structures. Bowl feeding can then be used to sort the clip structure 100 from the plurality of clip structures, to prepare for attachment of the clip structure 100 to the semiconductor die 201.

Before or after the one-piece clip structure 100 is formed, the die attach material 204 can be deposited on a semiconductor die 201 and/or on the leadframe structure 202. Then, the semiconductor die 201 can be attached to the leadframe structure 202.

The die attach material 204 can be deposited on a die attach location of the leadframe 202 and cured using any suitable process. Any suitable type of solder or other type of conductive material such as a conductive epoxy may be used (e.g., PbSn or lead free solder).

The semiconductor die 201 may include any suitable semiconductor device (such as a p-channel MOSFET die). Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. Exemplary vertical power devices are also described in U.S. Pat. Nos. 6,274,905 and 6,351,018, both of which are assigned to the same assignee as the present application, and both of which are herein incorporated by reference in their entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

After the leadframe structure 202 is attached to the semiconductor die 201, the one-piece clip structure 100 may be attached to the semiconductor die 201 and the leadframe structure 202 using solder 205 or some other type of conductive adhesive. As shown in FIG. 2A, connecting structure 103 overlaps with the semiconductor die 201.

Then, a solder reflow or curing step may take place followed by a cleaning step. A flux rinse may be performed for soft solder and a plasma process may be used for an epoxy material. This can result in the precursor shown in FIG. 2A.

In another example, after the clip structure 100 is obtained, it can be attached to the semiconductor die 201 such that connecting structure 103 overlaps with the semiconductor die 201. This can be done using solder 205 or some other type of conductive adhesive. Then, the semiconductor die 201 can be attached to the leadframe structure 202 using a die attach material 204, as described above. A solder reflow or curing step may take place followed by a cleaning step. A flux rinse may be performed for soft solder and a plasma process may be used for epoxy. This can result in the precursor structure shown in FIG. 2A.

As shown in FIG. 2B, a molding material 208, such as an epoxy molding compound, may be formed around at least a part of the one-piece clip structure 100, semiconductor die 201, and leadframe 202. The molding material 208 may be molded using conventional molding processes. Suitable molding temperatures and pressures may be determined by those of ordinary skill in the art.

The plating layer 101 and the upper surface of the connecting structure 103 of the clip structure 100 may not be covered (i.e., they are left exposed) by the molding material 208. The upper surface of the clip structure 100 is substantially coplanar with an exterior surface of the molding material 208.

In some embodiments, a portion of bottom surface 202A of the leadframe structure 202 is also not covered by the molding material 208 and so it is also left exposed. The bottom surface 202A may be substantially coplanar with a bottom exterior surface of the molding material 208.

The surfaces of the plating layer 101, connecting structure 103, and leadframe 202 that are not covered by molding material 208 in FIG. 2B (the "exposed surfaces") can be exposed by using a chemical-mechanical polishing process after molding. In another embodiment, the exposed surfaces can be covered by a mask (such as with photoresist) before the molding step, and the mask can then be removed after molding.

Figure 2C:
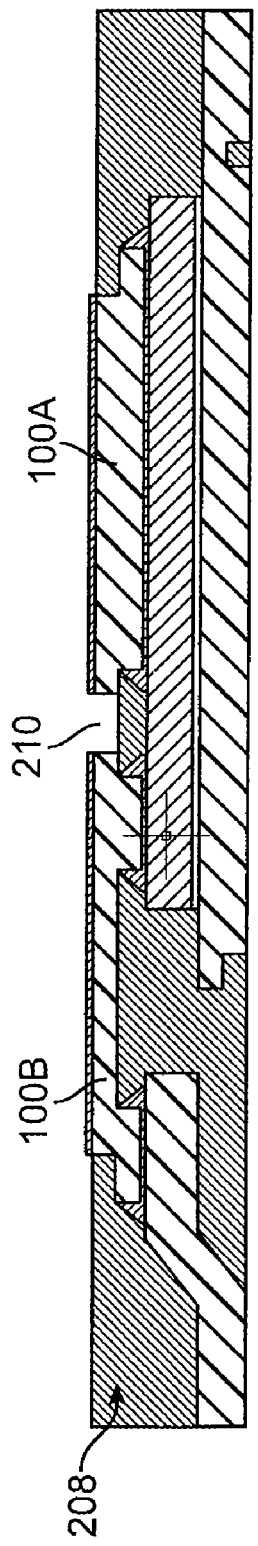

After molding, the connecting structure 103, or at least a portion of the connecting structure 103, can be removed, as shown in FIG. 2C. This step can separate the one-piece clip structure into two or more distinctive structures, including a second gate clip portion 100B and a first source clip portion 100A. The second gate clip portion 100B can be electrically couple to a gate region of semiconductor die 201 to a portion of the leadframe structure 202. The first source clip portion 100A can electrically couple a source region of the semiconductor die 201 to an external contact, such as other portions of the leadframe structure 202.

The removal of the connecting structure 103 can occur in any suitable manner, and may be performed by etching. If etching is used, the molding material 208 and the plating layer 101 can serve as etching masks. Consequently, only the connecting structure 103, or portions thereof, are removed.

After the connecting structure is removed, a slot 210 is left in the location where connecting structure 103 previously was located (i.e., the slots overlap with the semiconductor die 201).

Figure 2D:
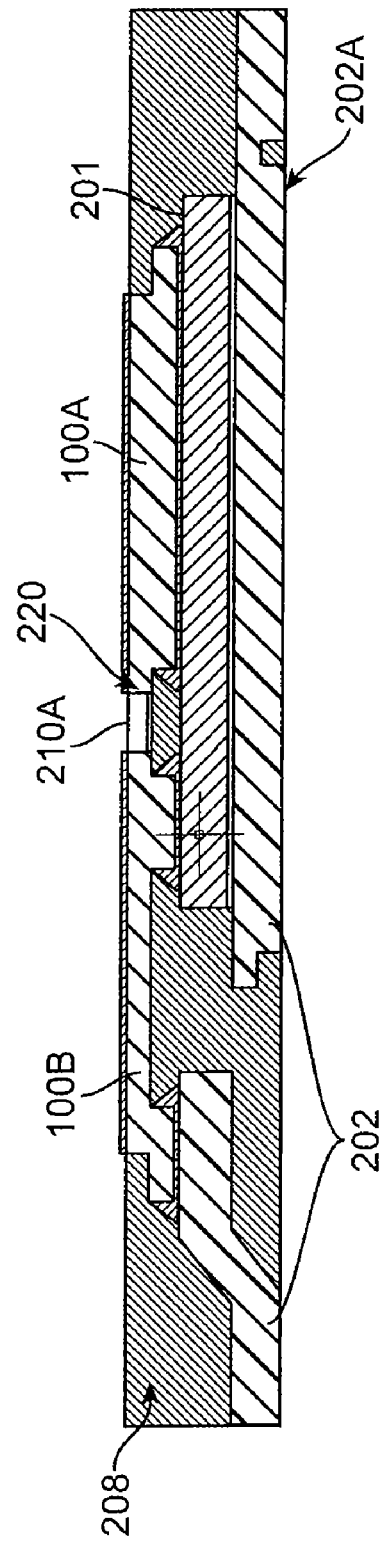

Slot 210 can be left as an empty opening in the molding material 208 as shown in FIG. 2C. In other embodiments, the slot 210 is filled in. For example, as shown in FIG. 2D, the slot 210 is filed with material 210A that comprises a molding material. This molding material may be of the same type as molding material 208, such as an epoxy molding compound. Alternatively, slot 210 can be filled with a different type of molding material 210A. In any event, as can be seen in FIG. 2D, there can be an interface 220 between slot filling material 210A and the previously molded molding material 208. The interface 220 is formed because the filling material 210A is deposited and is solidified after the molding material 208 is solidified.

Once the semiconductor die package has been formed as seen in FIG. 2C or 2D (depending on the embodiment), marking and singulation processes can be performed. This results in an MLP-type package for use in applications. Singulation can be performed using a sawing process. Singulation may alternatively be performed using a trimming process when the molding is performed on each package individually. Test, tape, and reel processes can also be performed. Marking may be performed using any suitable marking process (e.g., laser or ink marking).

FIGS. 3A and 3B show top perspective views of the precursors illustrated in FIGS. 2B and 2C, respectively. In FIG. 3A, a molding material 208 is molded around the clip structure 100 and semiconductor die (not shown). Molding material 208 does not cover a portion of a surface of the clip structure, including the plated surface 101 at the top of the first portion 100A and second portion 100B, and connecting structures 103. Also exposed by the molding material 208 are portions of leadframe structure 202, including leads that can be used for electrically connecting the formed semiconductor die package to a printed circuit board.

In FIG. 3B, the connecting structures 103 shown in FIG. 3A have been removed. This results in slots 210. In an exemplary embodiment, slots 210 can then be filled in with a molding material. In alternative embodiments, slots 210 can be left as empty spaces within molding material 208.

Figure 4A:
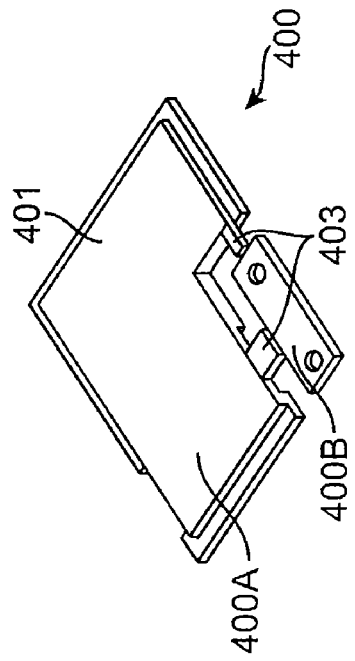
FIG. 4A illustrates another embodiment of a one-piece clip structure.
Figure 4B:
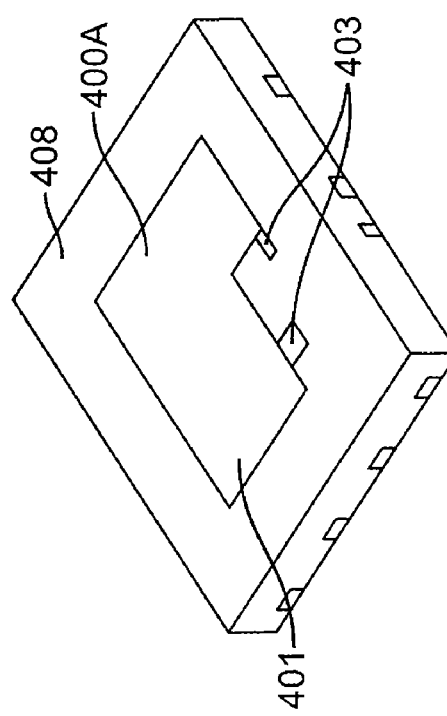
FIGS. 4B-4C illustrate top perspective views of precursors produced in the formation of a semiconductor die package according to an embodiment of the invention, using the one-piece clip structure shown in FIG. 4A.
Figure 4C:
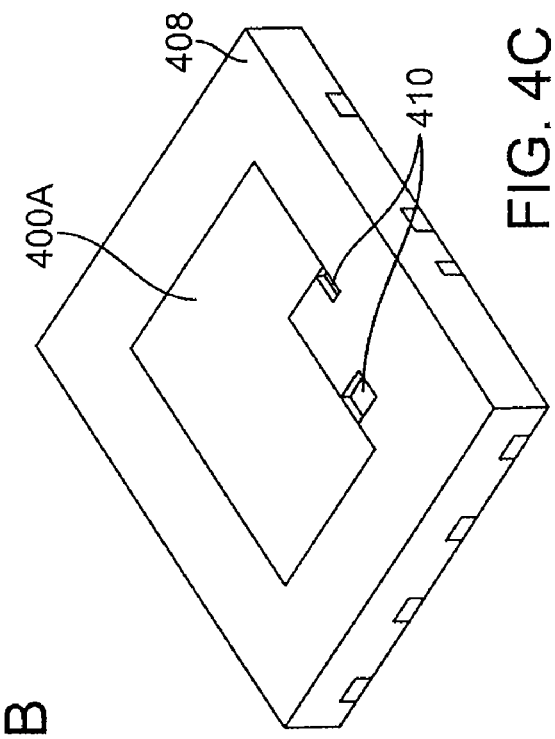

FIGS. 4A-4C illustrate another embodiment of the invention. FIG. 4A shows a one-piece clip structure 400 according to the embodiment. One-piece clip structure 400 is similar to one-piece clip structure 100 of FIG. 1, except that the plating layer 401 of clip structure 400 does not cover the base material of the second portion 400B. Plating layer 401 does cover the base material of the first portion 400A. In this way, when clip structure 400 is attached to a semiconductor die and leadframe (not shown) and molded, as shown in FIG. 4B, the second portion 400B is fully covered by molding material 408. Portions of one-piece clip structure 400 are left exposed by molding material 408, including portions of first portion 400A (those portions which are covered by plating layer 401), and connecting structures 403.

In FIG. 4C, the exposed portions of connecting structures 403 have been removed. This creates slots 410. As described above, in different examples, slots 410 can be left empty or they can be filled with a material such as a molding material of the same type as molding material 408. In the embodiment of FIGS. 4A-4C, the clip structure is substantially planar and can be easily attached to a semiconductor die. A first portion 400A, which can be a source clip for attaching to the source region of the semiconductor die, can remain uncovered by the molding material. This allows for connection to the source clip of objects such as a heat sink, to improve thermal performance. In this embodiment, second portion 400B remains covered by molding material, which provides environmental protection, and requires the use of less plating material 401.

Embodiments of the invention provide for a number of advantages. In forming a semiconductor die package, a gate clip and source clip can be connected by metal tie bars, constituting a planar, one-piece clip structure. With the flat and one-piece design of the clip structure, fabrication of the clip is simpler than in the prior art, which results in lower production costs. While connected by the tie bars, both the source clip and the gate clip can be attached to a package simultaneously, reducing production time and minimizing possible errors. Furthermore, the flat, regular shape of the one-piece clip has no deep downset and is sturdy. This uniquely allows for bowl feeding to be used in the clip attach process.

Exemplary embodiments of the invention also provide semiconductor die packages that are compatible with applications calling for standard power quad flat no-lead (PQFN) and micro leadframe packages (MLP). In certain implementations, portions of both the top and bottom of the semiconductor die package can be exposed by molding material. This can improve the thermal performance. The design can also be compatible with high density frame designs and multi-chip packages.

The clip structures and semiconductor die packages described above can be used in larger modules and systems. Such systems may include cellular phones, computers, servers, etc.

Any of the above-described embodiments and/or any features thereof may be combined with any other embodiment(s) and/or feature(s) without departing from the scope of the invention.

As used herein "top" and "bottom" surfaces are used in the context of relativity with respect to a circuit board upon which the semiconductor die packages according to embodiments of the invention are mounted. Such positional terms may or may not refer to absolute positions of such packages.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. For example, although the embodiments described above include semiconductor die packages with one semiconductor die, it is understood that there may be more than one semiconductor die in a semiconductor die package in other embodiments of the invention.

A recitation of "a", "an" or "the" is intended to mean "one or more" unless specifically indicated to the contrary.

What is claimed is:

1. A method of forming a semiconductor die package comprising:
    obtaining a clip structure including a first portion and a second portion, wherein the first portion is connected to the second portion by a connecting structure;
    attaching a semiconductor die to the clip structure, wherein the connecting structure overlaps with the semiconductor die;
    molding a molding material around the clip structure and semiconductor die; and
    removing at least a portion of the connecting structure after the attaching the semiconductor die and the molding the molding material.

2. The method of claim 1, wherein the clip structure is substantially planar.

3. The method of claim 1, wherein after molding, the molding material exposes surfaces of the first portion and the second portion.

4. The method of claim 1, wherein after molding, the molding material covers an entire surface of the second portion.

5. The method of claim 1, wherein the clip structure comprises a base material and a plating layer on the base material.

6. The method of claim 5, wherein the second portion does not include the plating layer.

7. The method of claim 5, wherein the base material comprises copper and the plating layer comprises nickel.

8. The method of claim 1, wherein the removing at least a portion of the connecting structure comprises etching.

9. The method of claim 1 wherein the molding material is a first molding material and removing the connecting structure forms a slot, the method further comprising filling the slot with a second molding material.

10. The method of claim 1, wherein the first portion is connected to the second portion by more than one connecting structure, further wherein the removing at least a portion of the connecting structure comprises removing at least a portion of each connecting structure.

11. The method of claim 1, further comprising attaching a leadframe structure to the semiconductor die.

12. A method of forming a semiconductor die package comprising:
    obtaining a clip structure including a first portion and a second portion, wherein the first portion is connected to the second portion by a connecting structure;
    attaching a semiconductor die to the clip structure, wherein the connecting structure overlaps with the semiconductor die;
    molding a molding material around the clip structure and semiconductor die; and
    removing at least a portion of the connecting structure, wherein the semiconductor die comprises a gate region and a source region, and wherein the first portion comprises a source clip that is electrically coupled to the source region and the second portion comprises a gate clip that is electrically coupled to the gate region.

* * * * *